United States Patent
Klosters et al.

(10) Patent No.: US 9,329,611 B2
(45) Date of Patent: May 3, 2016

(54) POWER CONTROL

(71) Applicant: NXP B.V., Eindhoven (NL)

(72) Inventors: Franciscus Johannes Klosters, Schaijk (NL); Clemens Gerhardus Johannes de Haas, Ewijk (NL)

(73) Assignee: NXP B.V., Eindhoven (NL)

( * ) Notice: Subject to any disclaimer, the term of this patent is extended or adjusted under 35 U.S.C. 154(b) by 235 days.

(21) Appl. No.: 14/094,507

(22) Filed: Dec. 2, 2013

(65) Prior Publication Data
US 2015/0153754 A1 Jun. 4, 2015

(51) Int. Cl.
| | |
|---|---|
| G06F 1/32 | (2006.01) |
| G05F 1/66 | (2006.01) |
| H04L 12/12 | (2006.01) |
| H04L 12/40 | (2006.01) |
| H03K 3/012 | (2006.01) |
| G06F 1/26 | (2006.01) |

(52) U.S. Cl.
CPC ............ *G05F 1/66* (2013.01); *G06F 1/3209* (2013.01); *G06F 1/3287* (2013.01); *H03K 3/012* (2013.01); *H04L 12/12* (2013.01); *H04L 12/40039* (2013.01); *G06F 1/26* (2013.01); *G06F 1/3215* (2013.01); *Y02B 60/1282* (2013.01); *Y02B 60/34* (2013.01)

(58) Field of Classification Search
CPC .................................... G05F 1/66; G06F 1/26
USPC ......................................................... 713/300
See application file for complete search history.

(56) References Cited

U.S. PATENT DOCUMENTS

| | | | | |
|---|---|---|---|---|
| 5,748,972 A * | 5/1998 | Clark | ........................ | G06F 1/30 307/66 |
| 5,892,893 A * | 4/1999 | Hanf | ..................... | G06F 1/3209 714/14 |
| 6,115,831 A * | 9/2000 | Hanf | .................... | B60R 16/0315 714/43 |
| 2005/0076254 A1* | 4/2005 | Robinson | .............. | G06F 1/3209 713/320 |
| 2006/0058075 A1* | 3/2006 | Remy | ................ | G06K 7/10079 455/574 |
| 2006/0253718 A1* | 11/2006 | Kawase | ................ | G06F 1/3203 713/300 |

(Continued)

FOREIGN PATENT DOCUMENTS

| | | |
|---|---|---|
| EP | 1 717 664 A2 | 11/2006 |
| WO | 2006120612 A2 | 11/2006 |

OTHER PUBLICATIONS

TJA1145 Product Data Sheet, "High-Speed CAN Transceiver for Partial Networking", Rev. 1-27 Sep. 2013.

(Continued)

*Primary Examiner* — Thomas Lee
*Assistant Examiner* — Volvick Derose
(74) *Attorney, Agent, or Firm* — Rajeev Madnawat

(57) ABSTRACT

As may be implemented in accordance with one or more embodiments, an event manager provides control of a battery-powered internal power supply. The power supply has a control port that receives a control signal for activating and deactivating the internal power supply, and one or more output ports for providing a power signal. The event manager includes a plurality of system-event circuits that detect activity signals corresponding to a respective one of a plurality of system events. An event validation circuit, which is powered by the power signal, provides a validation signal that is based upon an activity signal detected by the event manager circuit and that indicates that the internal power supply should provide the power signal in a non-sleep power-operation mode.

20 Claims, 3 Drawing Sheets

(56) References Cited

U.S. PATENT DOCUMENTS

2010/0007334 A1* 1/2010 Apfel ................ H04L 12/10 324/123 R
2010/0042859 A1* 2/2010 Chien ................ G06F 1/3203 713/323
2013/0103959 A1* 4/2013 Hatta ................ H04L 12/12 713/310
2014/0219154 A1* 8/2014 Liu ................ G06F 1/3206 370/311
2015/0021987 A1* 1/2015 Stevens ................ H02J 1/102 307/18

OTHER PUBLICATIONS

Extended European Search Report for EP Patent Appln. No. 14190133.0 (Apr. 15, 2015).

* cited by examiner

POWER CONTROL

Aspects of various embodiments are directed to power control circuits and methods.

Many circuits and applications benefit from low power (e.g., current) consumption. For instance, mobile device circuits and automotive integrated circuits have seen increasing benefit from low power consumption. For automobiles, the amount of silicon-type circuits is increasing, and such circuits are mostly directly fed by a battery. Accordingly, this draw can place heavy load on the battery when the motor is turned off, may affect battery life and/or increase the possibility of draining a battery after a long period without being recharged.

In some implementations, circuits employ some sort of a standby or sleep mode in which the current consumption is reduced. When circuits are to be used, wake-up functionality is implemented to return the circuits to a higher current/power mode. However, such approaches have been increasingly challenging to implement, such as in applications involving mixed signal circuits. For instance, standby current may depend upon both dynamic and static current (e.g., leakage, which can be exacerbated at high temperatures).

These and other matters have presented challenges to managing power consumption, for a variety of applications, such as in applications employing a SBC (system basis chip), a controller area network (CAN), local interconnect network (LIN), and other in-vehicle networking (IVN) applications for automotive applications.

Various example embodiments are directed to power control circuits, related methods and their implementation.

According to an example embodiment, a circuit includes an internal power supply for powering by a battery, and having a control port that receives a control signal for activating and deactivating the internal power supply, and at least one output port that provides a power signal. An event manager circuit includes a plurality of system-event circuits, each of which detects activity signals corresponding to a respective one of a plurality of system events. An event validation circuit, which is powered by the power signal, provides a validation signal based upon an activity signal detected by the event manager circuit, and indicates that the internal power supply should provide the power signal in a non-sleep power-operation mode. In some implementations, the event manager circuit provides the control signal in response to or otherwise based on one or both of the validation signals and an activity signal detected by one of the system-event circuits.

Another example embodiment is directed to a method as follows. A power signal is provided via at least one output port of an internal power supply that is powered by a battery and that has a control port that receives a control signal for activating and deactivating the internal power supply. A plurality of system-event circuits, in an event manager circuit, are used to detect activity signals corresponding to a respective one of a plurality of system events. Power provided by the power signal is used to provide a validation signal based upon an activity signal detected by the event manager circuit, and an indication is provided which indicates that the internal power supply should provide the power signal in a non-sleep power-operation mode.

Another embodiment is directed to an apparatus having an internal power supply, an event manager and an event validation circuit. The power supply uses battery power to operate a plurality of analog and digital circuits in a non-sleep power mode, and disconnects power to the plurality of analog and digital circuits in a sleep power mode. The event manager circuit detects activity signals corresponding to a respective one of a plurality of system events presented via one of a plurality of inputs. The event validation circuit is connected to and powered by the internal power supply in the non-sleep power mode, evaluates activity signals detected by the event manager circuit, and provides a validation signal in response to the evaluation indicating that an activity signal is valid. The event manager circuit controls operation of the internal power supply by operating the internal power supply in the non-sleep power mode for a predetermined amount of time in response to detecting an activity signal, continuing to provide the control signal in response to receiving the validation signal prior to expiration of the predetermined amount of time, and discontinuing the control signal in response to not receiving the validation signal.

The above discussion/summary is not intended to describe each embodiment or every implementation of the present disclosure. The figures and detailed description that follow also exemplify various embodiments.

Various example embodiments may be more completely understood in consideration of the following detailed description in connection with the accompanying drawings, in which.

Figure 1:
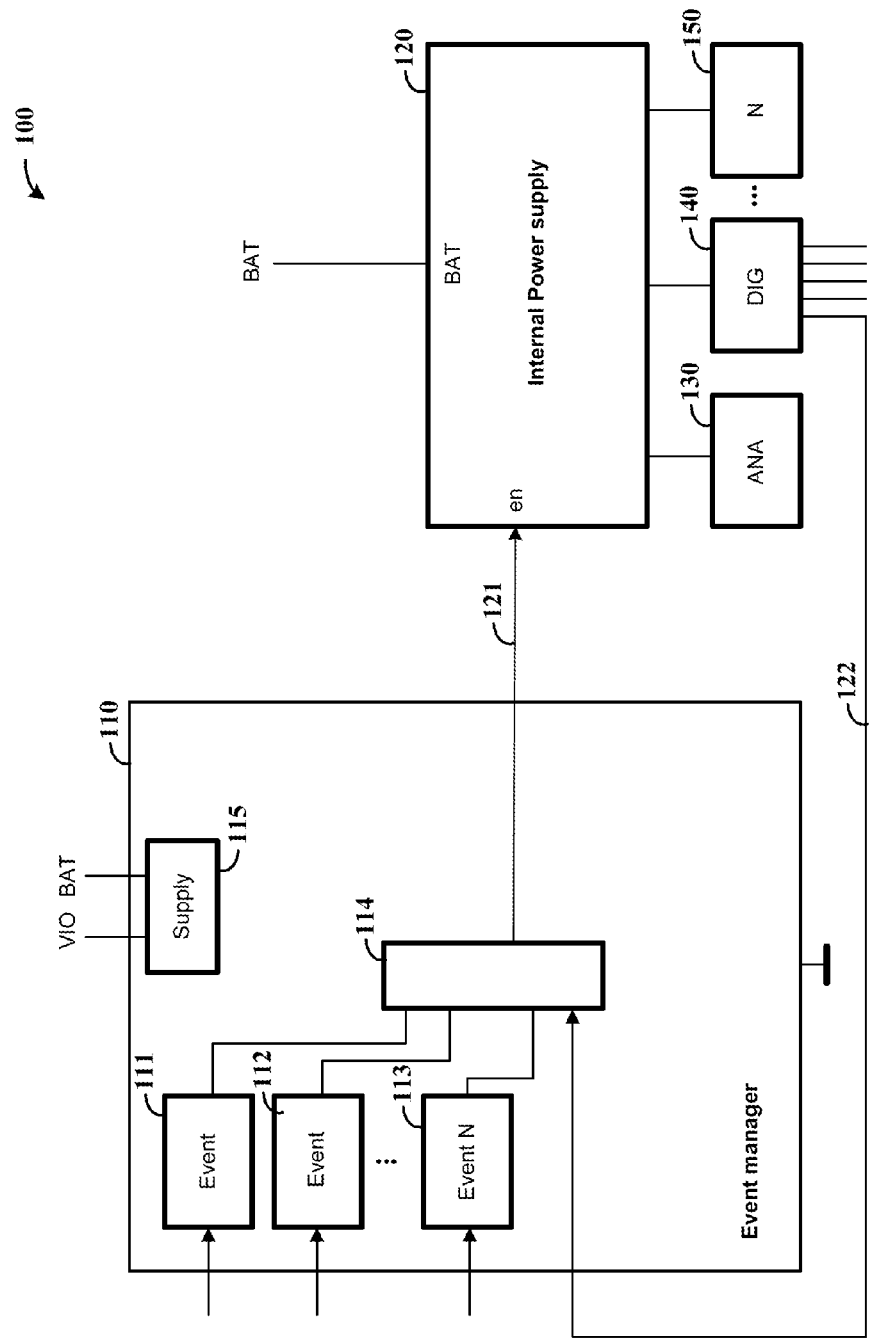
FIG. 1 shows an apparatus that provides power for operating circuits and controls the application of power in a sleep mode, in accordance with an example embodiment.

While various embodiments discussed herein are amenable to modifications and alternative forms, aspects thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

Aspects of the present disclosure are believed to be applicable to a variety of different types of apparatuses, systems and methods involving the control of power applied to a circuit, as may be applicable to a sleep mode and a powered, or wake mode. While not necessarily so limited, various aspects may be appreciated through a discussion of examples using this context.

Various example embodiments are directed to controlling the operation of a circuit in respective power states. In one embodiment, an apparatus includes a power-control circuit in which all (analog and digital) circuits are powered by an internal power supply, with the exception of a small event manager circuit block. The event manager controls the supply of power to the analog and digital circuits in response to an event (e.g., receiving an input value/signal). One of the analog and digital circuits evaluates the event to determine whether the event is valid. If the event is valid, the event manager continues to control the supply of power to the analog and digital circuits. If the event is not valid, the event manager terminates the supply of power, such as by terminating an enable signal or actively disconnecting the internal power supply. Such an approach may be implemented, for example, to facilitate implementation of an additional block to provide power conservation, with operation in a low-power mode in which no or very little supply current is used.

In accordance with a more particular embodiment, an internal power supply, an event manager and an event validation circuit operate to provide power via the power supply using a non-sleep power-operation mode. The internal power supply includes a control port that receives and uses a control signal for activating and deactivating the internal power supply, for providing a power signal via an output port (e.g., using battery power). The event manager includes system-event circuits that detect activity signals corresponding to a respective one of a plurality of system events. Such events may, for example, correspond to events relating to a wake event (e.g., a battery-related (12V) input signal, with an actuator including one or more switches connected to a battery in or outside the module 210), a digital input or signals communicated using CAN (controller-area network) or LIN (local interconnect network) circuits. The event validation is powered by the power signal and provides a validation signal based upon an activity signal detected by the event manager circuit, and indicates whether the internal power supply should provide the power signal in a non-sleep power-operation mode. For instance, when the event validation circuit provides the event validation signal, the internal power supply can be operated in the non-sleep power-operation mode.

In some embodiments, the event manager, which can be powered independently from the internal power supply, provides the control signal in response to either an activity signal detected by one of the system-event circuits or the validation signal. For instance, when an activity signal is detected, such as a signal indicative of an active input being received, the event manager can provide the control signal to cause the internal power supply to power circuits that use the active input. The event validation circuit then evaluates the active input to ensure that the input is valid (e.g., is not noise or an errant signal), and upon confirmation that the input is valid, provides the validation signal. In certain implementations, the event manager terminates the control signal in the absence of the validation signal (e.g., to operate the internal power supply in a sleep power-operation mode).

The validation signal can be used in different manners, to suit different embodiments. In some embodiments, the event manager continues to provide the control signal when the validation signal is present, thus maintaining the internal power supply in the non-sleep mode. If the validation signal is not received (e.g., after a predetermined time after detecting the activity signal, or is terminated), the event manager controls the internal power supply to stop providing the power. Such an approach may involve ceasing to provide the control signal, or providing a signal that disconnects the power.

In some embodiments, the event manager circuit provides the control signal for a predetermined amount of time in response to the activity signal being detected by one of the system-event circuits, continues providing the control signal in response to receiving the validation signal prior to expiration of the predetermined amount of time, and discontinues providing the control signal in response to not receiving the validation signal prior to expiration of the predetermined amount of time. In certain implementations, the predetermined amount of time is sufficient for the validation circuit to transition from a sleep power-operation mode to the non-sleep power-operation mode, and to evaluate the likelihood that the one of the activity signals corresponds to a valid system event. The event validation circuit switches to the non-sleep power operation mode in response to the power supply being coupled via the control signal, and in which power is consumed from the internal power supply relative to the sleep power-operation mode.

In a more particular embodiment, the event manager circuit initially provides the control signal for a predetermined amount of time in response to the activity signal being detected by one of the system-event circuits. The event validation circuit transitions from a low-power mode to a non-sleep power operation mode, using the power signal provided in response to the control signal, and evaluates a likelihood that one of the activity signals corresponds to a valid system event during the predetermined amount of time. If the evaluation is indicative of a valid system event, the event validation circuit provides the validation signal. The event manager circuit thus initially provides the control signal in response to activity signal detected by one of the system-event circuits, and continues providing the control signal after expiration of the predetermined amount of time, when the validation signal is provided prior to expiration of the predetermined amount of time. If the validation signal is not received prior to expiration of the predetermined amount of time, the event manager stops providing the control signal.

Accordingly, the predetermined amount of time can be set to an amount of time that is sufficient for the validation circuit to transition from a sleep power-operation mode to the non-sleep power-operation mode, and to both evaluate the likelihood that the one of the activity signals corresponds to a valid system event and provide the validation signal. In the non-sleep power operation mode, the power supply is coupled via the control signal and more power is consumed from the internal power supply, relative to the sleep power-operation mode.

The internal power supply is controlled and used to provide power in one or more of a variety of manners. In some embodiments, the internal power supply provides power to a plurality of analog and digital circuits that operate in the non-sleep power-operation mode in response to the provided power. When the power is not provided and/or otherwise terminated as discussed herein, the analog and digital circuits operate in a sleep power-operation mode in which less power is consumed. A sleep-mode circuit terminates providing of the validation signal in response to a sleep-mode event, thereby terminating the control signal, in response to which the internal power supply transitions to the sleep power-operation mode and disconnects power from the analog and digital circuits.

The activity signal is detected in a variety of manners, to suit particular applications. In one embodiment, an event manager circuit such as discussed above includes a trigger circuit that provides a trigger signal in response to one of the system-event circuits detecting an activity signal. An OR circuit (e.g., a logical OR circuit) has respective input ports coupled to receive both the trigger signal and the validation signal, and provides the control signal in response to one of the trigger signals and the validation signal being presented to the respective input ports.

In some embodiments, an event manager circuit as discussed herein includes a memory circuit powered independently from the internal power supply, and includes one or more digital circuits that facilitate the non-sleep and sleep modes. Data is stored in the memory circuit prior to transitioning into a sleep power-operation mode, to facilitate retention of such data (e.g., as otherwise retained by power provided in the non-sleep power operation mode). The memory circuit may, for example, include a random access memory (RAM) circuit and/or one or more flip-flops.

In some embodiments, the event manager circuit includes a plurality of status-indicator circuits (e.g., flip-flops), each of which indicates the status of one or more of the system-event circuits. The event validation circuit provides the validation signal in response to evaluating whether the status indicated by one of the status-indicator circuits corresponds to a valid one of the plurality of system events.

Another example embodiment is directed to a method in which a power signal is provided via an internal power supply powered by a battery, using a control signal for activating and deactivating the internal power supply. Activity signals corresponding to a respective one of a plurality of system events are detected and evaluated using power provided by the internal power supply, and a validation signal is provided based upon the evaluation. The validation signal indicates that the internal power supply should provide the power signal in a non-sleep power-operation mode. The activity signals may, for example, be detected using an event manager and evaluated using a validation circuit as discussed herein. In some implementations, the control signal is provided in response to either a detected activity signal or the validation signal.

In some embodiments, the control signal is provided for a predetermined amount of time in response to one or more activity signals. During the predetermined amount of time and after transitioning from a low-power mode to a high-power mode using power provided in response to the control signal, a likelihood that one of the activity signals corresponds to a valid system event is evaluated. The validation signal is provided in response to the evaluation being indicative of the valid system event. As such, the control signal continues to be provided if the validation signal is received prior to expiration of the predetermined amount of time, and is discontinued if the validation signal is not received, prior to expiration of the predetermined amount of time. The predetermined amount of time may, as discussed above, be a sufficient amount of time to allow a transition from a sleep power-operation mode to a non-sleep power-operation mode (in which more power is consumed), and to evaluate the likelihood that the one of the activity signals corresponds to a valid system event.

In some embodiments, analog and digital circuits are operated in a non-sleep power-operation mode by providing the control signal in response to the validation signal, and operated in a sleep power-operation mode (e.g., as above) by ceasing to provide the control signal in response to the absence of the validation signal. The internal power supply is thus controlled to disconnect the power signal from all of the analog and digital circuits.

Turning now to the figures, FIG. 1 shows an apparatus 100 that provides power for operating circuits and controls the application of power in a sleep mode, in accordance with an example embodiment. The apparatus 100 includes an event manager 110, an internal power supply 120, and a plurality of circuits that are powered by the power supply, including analog circuit(s) 130, digital circuit(s) 140 and, in some implementations, other circuits 150.

The event manager 110 is shown including input circuits (e.g., system-event circuits) 111, 112 and 113, with the understanding that more or fewer of such input circuits may be used in accordance with one or more embodiments. The event manager 110 also includes a circuit 114 that provides an enable signal 121 (e.g., a control signal) to the internal power supply 120 and another power supply 115. In response to an input signal received on one of the input circuits 111, 112 and 113, the circuit 114 provides the enable signal to control the power supply 120 to provide power to one or more of the circuits 130, 140 and 150.

While powered, one of the circuits 130, 140 and 150 evaluates the signal received on one of the input circuits and determines whether the signal is valid. By way of example, FIG. 1 shows this evaluation being performed at digital circuit 140 (e.g., by an event validation circuit therein). If the signal is valid, a validation signal 122 is provided to circuit 114, which provides the enable signal 121 in response thereto.

In some embodiments, the apparatus 100 operates as follows. The event manager 110 is powered using the power supply 115, and is generally on during a low-power mode to monitor for events while the circuits 130, 140 and 150 are not powered. When an input is detected at one of the input circuits 111, 112 and 113, circuit 114 generates the enable signal 121 for a predetermined amount of time (e.g., using a counter internal to circuit 114). During that predetermined time, the internal power supply 120 powers an evaluation circuit within the digital circuit block 140, which determines whether or not the input is valid. In some implementations, the power provided via supply 115 is higher during the predetermined time, to facilitate operation of the event manager 110. If the input is valid, the validation signal 122 is provided. The circuit 114 maintains the enable signal 121 if the validation signal 122 is received prior to the expiration of the predetermined amount of time, and otherwise discontinues the enable signal. In some implementations, the circuit 114 stops providing the enable signal 121 if the validation signal 122 is subsequently terminated, or in response to another signal indicating a transition to a sleep mode should be made.

In some embodiments, the event manager 110 is an analog circuit that facilitates simulations (e.g., functional and current consumption) on a transistor level. Once validated, a macro corresponding to this block can be used in projects without the need of extensive simulations.

Figure 2:
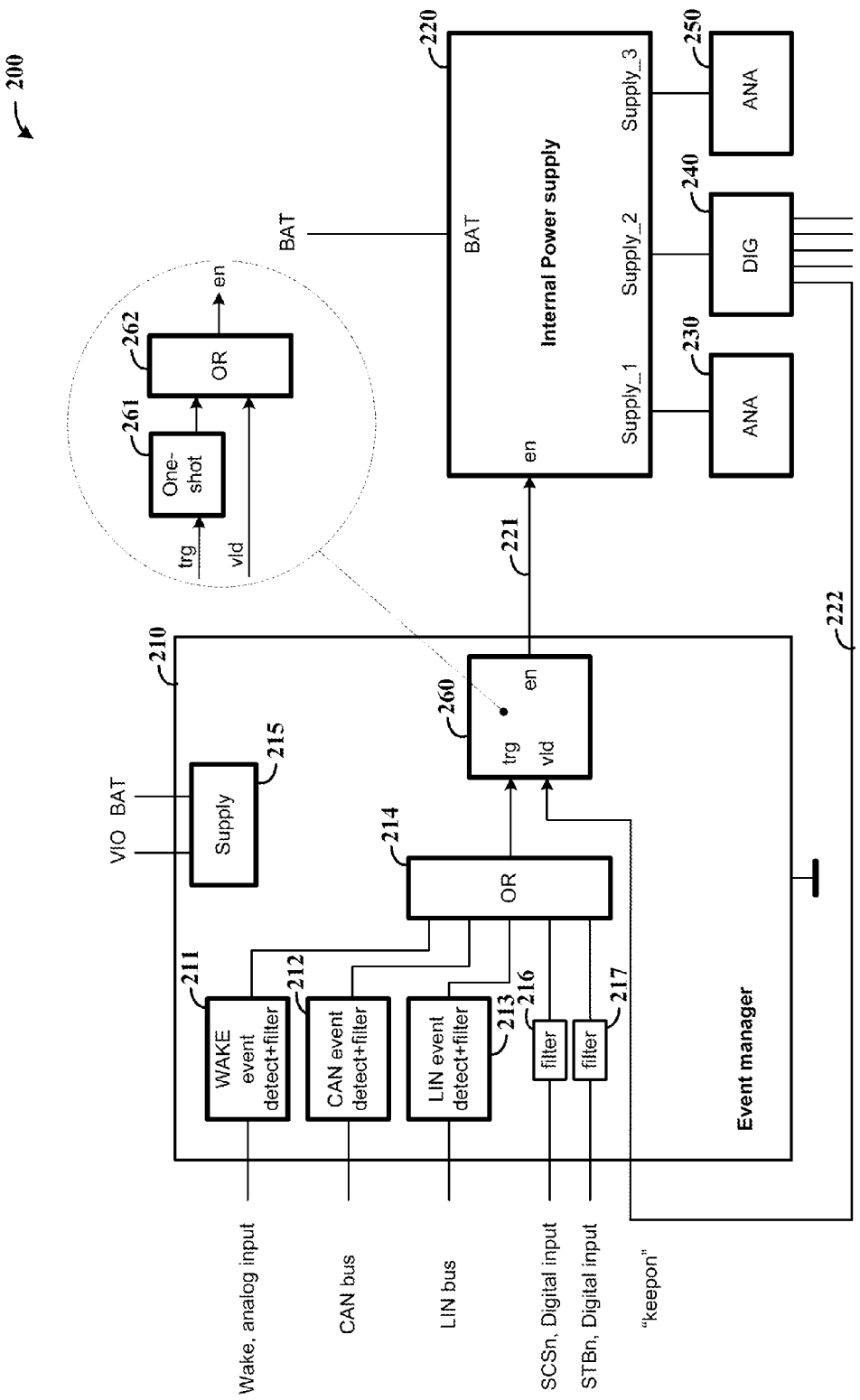
FIG. 2 shows another apparatus that provides power, in accordance with an example embodiment.

Referring now to FIG. 2, another apparatus 200 provides power, in accordance with an example embodiment. The apparatus 200 may, for example, be implemented using approaches similar to those described above in connection with the apparatus 100, with similar components being labeled similarly. An event manager 210 is powered by power supply 215 and includes event detection/filter circuits 211, 212 and 213 respectively coupled to detect WAKE, CAN and LIN events. Filter circuits 216 and 217 also detect digital inputs (shown by way of example as SCSn ((SPI Chip select signal)) and STBn ((standby control input pin)), respectively). The event manager 210 also includes an OR circuit 214 and an enable circuit 260, which operate together to provide an enable signal to an internal power supply 220 that is responsive to the enable signal by powering circuits 230, 240 and 250 via respective supply outputs for supply 1, supply 2 and supply 3.

In some embodiments, the apparatus 200 operates as follows. In response to detecting an input on one of circuits 211, 212, 213, 216 and 217, the OR circuit 214 provides a signal to a trigger input of the enable circuit 260. The enable circuit 260 then provides an enable signal 221, which causes the internal power supply 220 to power at least digital circuit 240, which in turn evaluates the received input. The enable signal is initially provided for an amount of time that is sufficient for the digital circuit 240 to evaluate the received input. If the input is valid, the digital circuit 240 provides the validation signal 222 to a validation input of the enable circuit 260, which continues to provide the enable signal 221 in response thereto. In some implementations, the enable circuit 260 includes a one-shot stable multivibrator circuit 261 coupled to the trigger input, and an OR circuit 262 that provides the enable signal based on either the output of the one-shot multivibrator circuit or the validation signal being present. In certain implementations, filters on one or more of input circuits 211, 212 and 213 filter inputs received by providing a signal to the OR circuit after a signal is received for a set time (e.g., to counter noise or transients).

In some implementations, circuits 216 and 217 are designed in such way that in the default (inactive) state, no or very little supply current is used. These inputs can be used to detect wake ups from the module where the product is built in from a host SPI interface or control pins.

Figure 3:
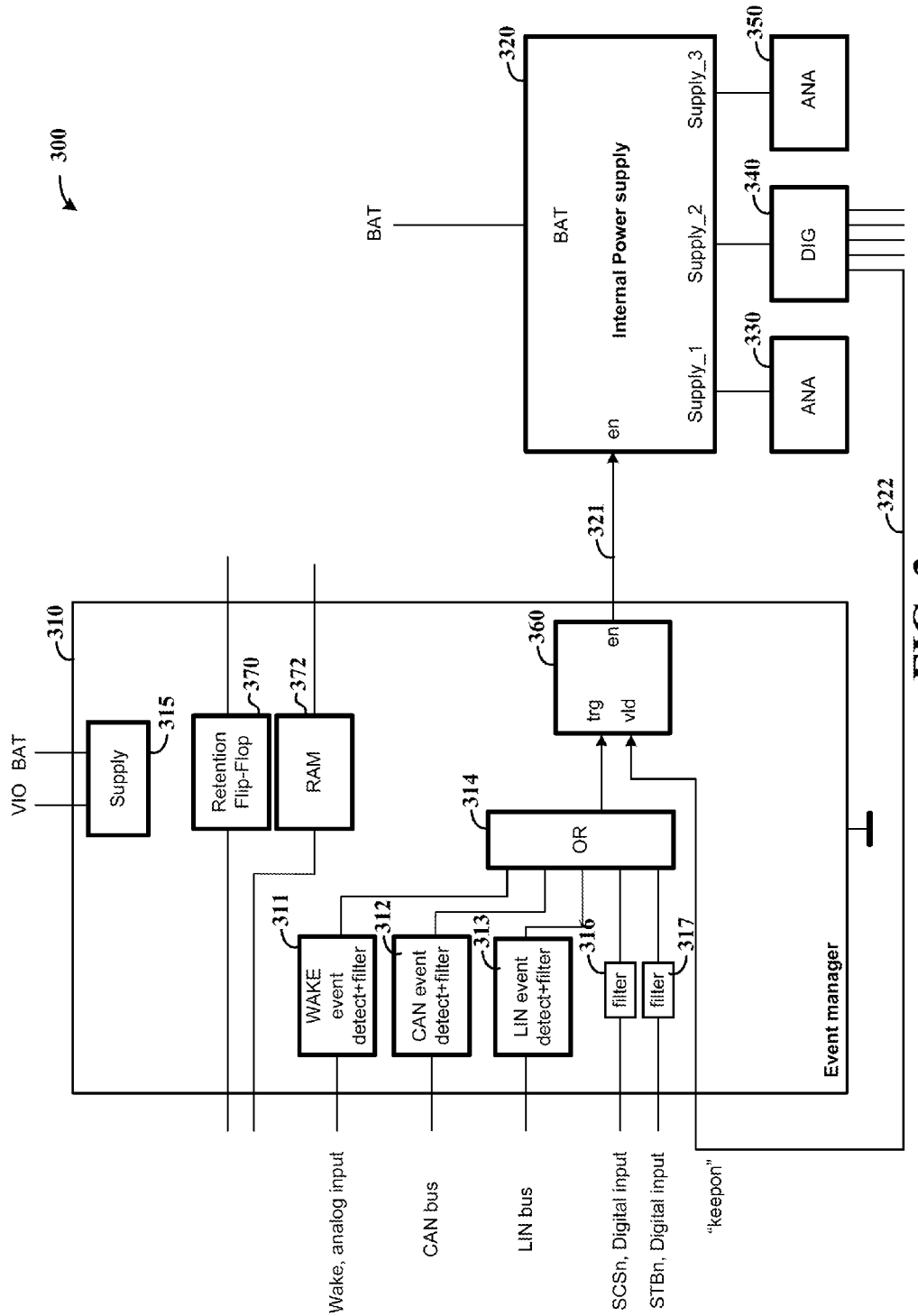
FIG. 3 shows another apparatus that provides power and resident memory, in accordance with an example embodiment.

FIG. 3 shows another apparatus 300 that provides power and resident memory, in accordance with an example embodiment. As with the above, the apparatus 300 may, for example, be implemented in a manner similar to that described in connection with FIG. 1 or 2, with similar components having similar labels. An event manager 310 is powered by power supply 315 and includes event detection/filter circuits 311, 312 and 313 respectively coupled to detect WAKE, CAN and LIN events. Filter circuits 316 and 317 also detect digital inputs (shown by way of example as SCSn (SPI Chip select signal) and STBn (standby control input pin), respectively). The event manager 310 also includes an OR circuit 314 and an enable circuit 360, which operate together to provide an enable signal 321 to an internal power supply 320. The power supply 320 is responsive to the enable signal by powering circuits 330, 340 and 350.

The apparatus 300 operates in a sleep mode in which the event manager 310 is powered and monitors inputs via circuits 311, 312, 313, 316 and 317. When an input is received and passed via OR circuit 314, enable circuit 360 generates enable signal 321. The internal power supply 320 is responsive to this enable signal 321 by powering one or more of circuits 330, 340 and 350. By way of example, circuit 340 evaluates the received input and, if valid, provides a validation signal 322 that is passed to a validation input on the enable circuit 360. If this validation signal 322 is received before the expiration of an initial time period, the enable circuit 360 continues to provide the enable signal 321.

The event manager 310 also includes a memory circuit having one or both of a retention flip-flop circuit 370 and RAM 372, which are supervised via the power supply 315 to maintain content. The memory circuit may, for example, store configuration data or SPI register data, or other data that may be used by one of more of circuits 330, 340 and 350 that would be susceptible to loss when power to these circuits is terminated. After an event is detected and the enable signal 321 is provided followed by the validation signal 322, a normal mode is entered in which the data is copied back to one or more of circuits 330, 340 and 350. In some embodiments, powered and unpowered signals are isolated to avoid unwanted current paths.

Various blocks, modules or other circuits may be implemented to carry out one or more of the operations and activities described herein and/or shown in the figures. In these contexts, a "block" (also sometimes "logic circuitry" or "module") is a circuit that carries out one or more of these or related operations/activities (e.g., generating an enable/control signal, verifying an input signal/status, or providing a validation signal). For example, in certain of the above-discussed embodiments, one or more modules are discrete logic circuits or programmable logic circuits configured and arranged for implementing these operations/activities, as in the circuit modules shown in FIG. 1. In certain embodiments, such a programmable circuit is one or more computer circuits programmed to execute a set (or sets) of instructions (and/or configuration data). The instructions (and/or configuration data) can be in the form of firmware or software stored in and accessible from a memory (circuit). As an example, first and second modules include a combination of a CPU hardware-based circuit and a set of instructions in the form of firmware, where the first module includes a first CPU hardware circuit with one set of instructions and the second module includes a second CPU hardware circuit with another set of instructions.

Certain embodiments are directed to a computer program product (e.g., nonvolatile memory device), which includes a machine or computer-readable medium having stored thereon instructions which may be executed by a computer (or other electronic device) to perform these operations/activities.

Based upon the above discussion and illustrations, those skilled in the art will readily recognize that various modifications and changes may be made to the various embodiments without strictly following the exemplary embodiments and applications illustrated and described herein. For example, different types of monitoring or sense circuits can be used to monitor input signals. In addition, one or more circuits may be kept on, or powered, in addition to event manager type circuits (e.g., in addition to memory type circuits as described with FIG. 3). Such modifications do not depart from the true spirit and scope of various aspects of the invention, including aspects set forth in the claims.

What is claimed is:

1. A circuit comprising:
    an internal power supply configured and arranged to be powered by a battery and including
        a control port configured to receive a control signal for activating and deactivating the internal power supply, and
        at least one output port configured and arranged to provide a power signal;
    an event manager circuit including a plurality of system-event circuits, each of the system-event circuits configured and arranged to detect activity signals corresponding to a respective one of a plurality of system events; and
    an event validation circuit configured and arranged to evaluate an activity signal detected by the event manager and to provide a validation signal based upon the activity signal, and to indicate that the internal power supply should provide the power signal in a non-sleep power-operation mode, wherein the evaluation of the activity signal include determining if the activity signal is a valid signal.

2. The circuit of claim 1, wherein the event manager circuit is configured and arranged to provide the control signal in response to at least one of an activity signal detected by one of the system-event circuits, and the validation signal.

3. The circuit of claim 1, wherein
    the event manager circuit is configured and arranged to provide the control signal for a predetermined amount of time in response to the activity signal being detected by one of the system-event circuits,
    the event validation circuit is configured and arranged to transition from a low-power mode to a high-power mode, using the power signal provided in response to the control signal, and to evaluate, during the predetermined amount of time, a likelihood that one of the activity signals corresponds to a valid system event, and to provide the validation signal in response to the evaluation being indicative of the valid system event, and
    the event manager circuit is configured and arranged to provide the control signal in response to at least one of an activity signal detected by one of the system-event circuits and the validation signal, and after expiration of the predetermined amount of time, to
        continue providing the control signal in response to receiving the validation signal prior to expiration of the predetermined amount of time, and
        discontinue providing the control signal in response to not receiving the validation signal prior to expiration of the predetermined amount of time.

4. The circuit of claim 3, wherein the predetermined amount of time is an amount of time sufficient for the validation circuit to transition from a sleep power-operation mode to the non-sleep power-operation mode in which more power is consumed from the internal power supply than in the sleep power-operation mode in response to the power supply being coupled via the control signal, and to evaluate the likelihood that the one of the activity signals corresponds to a valid system event.

5. The circuit of claim 1, wherein the event manager circuit is configured and arranged to:
provide the control signal for a predetermined amount of time in response to the activity signal being detected by one of the system-event circuits,
continue providing the control signal in response to receiving the validation signal prior to expiration of the predetermined amount of time, and
discontinue providing the control signal in response to not receiving the validation signal prior to expiration of the predetermined amount of time.

6. The circuit of claim 5, wherein the predetermined amount of time is an amount of time sufficient for the validation circuit to transition from a sleep power-operation mode to the non-sleep power-operation mode in which more power is consumed from the internal power supply than in the sleep power-operation mode in response to the power supply being coupled via the control signal, and to evaluate the likelihood that the one of the activity signals corresponds to a valid system event.

7. The circuit of claim 1,
further including a plurality of analog and digital circuits configured and arranged to operate in the non-sleep power-operation mode in response to the power signal being provided via the at least one output port, and to operate in a sleep power-operation mode in which less power is consumed from the internal power supply than in the non-sleep power-operation mode,
further including a sleep-mode circuit configured and arranged to terminate providing of the validation signal in response to a sleep-mode event, thereby terminating the control signal, and
wherein the internal power supply is configured and arranged to transition to the sleep power-operation mode in response to the control signal being terminated, by disconnecting the power signal from all of the analog and digital circuits.

8. The circuit of claim 1, wherein the event manager circuit includes
a trigger circuit configured and arranged to provide a trigger signal in response to one of the system-event circuits detecting an activity signal, and
an OR circuit having respective input ports coupled to receive the trigger signal and the validation signal, and being configured and arranged to provide the control signal in response to one of the trigger signal and the validation signal being presented to the respective input ports.

9. The circuit of claim 1,
wherein the event manager circuit includes a memory circuit configured and arranged to be powered independently from the internal power supply, and
further including a at least one digital circuit configured and arranged to
operate in the non-sleep power-operation mode in response to the power signal being provided via the at least one output port, and operate in a sleep power-operation mode in which less power is consumed from the internal power supply than in the non-sleep power-operation mode, and
store data in the memory circuit prior to transitioning from the non-sleep power-operation mode to the sleep power-operation mode.

10. The circuit of claim 9, wherein the memory circuit includes at least one of random access memory (RAM) circuit and at least one flip-flop.

11. The circuit of claim 1, wherein the event manager circuit is configured and arranged to operate the internal power supply in the non-sleep power-operation mode in which more power is consumed from the internal power supply than in a sleep power-operation mode by providing the control signal, and to operate the internal power supply in the sleep power-operation mode by terminating the control signal.

12. The circuit of claim 1, wherein the event manager circuit is configured and arranged to be powered by the battery independently from power provided from the battery to the internal power supply.

13. The circuit of claim 1, wherein the event manager circuit further includes a plurality of status-indicator circuits, each of the status-indicator circuits configured and arranged to indicate the status of one or more of the system-event circuits, and
the event validation circuit is configured and arranged to provide the validation signal in response to evaluating whether the status indicated by one of the plurality of status-indicator circuits corresponds to a valid one of the plurality of system events.

14. A method comprising:
in an internal power supply configured and arranged to be powered by a battery and having a control port configured to receive a control signal for activating and deactivating the internal power supply, providing a power signal via at least one output port;
in an event manager circuit including a plurality of system-event circuits, using the system-event circuits to detect activity signals corresponding to a respective one of a plurality of system events; and
using power provided by the power signal, providing a validation signal based upon an activity signal detected by the event manager circuit, and indicating that the internal power supply should provide the power signal in a non-sleep power-operation mode, wherein the validation signal is produced by evaluating the activity signal to determine if the activity signal is a valid signal.

15. The method of claim 14, further including providing, using the event manager circuit, the control signal in response to at least one of an activity signal detected by one of the system-event circuits, and the validation signal.

16. The method of claim 14, further including
providing, using the event manager circuit, the control signal for a predetermined amount of time in response to the activity signal being detected by one of the system-event circuits,
transitioning from a low-power mode to a high-power mode, using the power signal provided in response to the control signal, and evaluating, during the predetermined amount of time, a likelihood that one of the activity signals corresponds to a valid system event, and providing the validation signal in response to the evaluation being indicative of the valid system event,
providing the control signal in response to at least one of an activity signal detected by one of the system-event circuits and the validation signal, and after expiration of the predetermined amount of time,
continuing to provide the control signal in response to receiving the validation signal prior to expiration of the predetermined amount of time, and
discontinuing the control signal in response to not receiving the validation signal prior to expiration of the predetermined amount of time.

17. The method of claim 16, wherein the predetermined amount of time is an amount of time sufficient to transition from a sleep power-operation mode to the non-sleep power-operation mode in which more power is consumed from the internal power supply than in the sleep power-operation mode in response to the power supply being coupled via the control signal, and to evaluate the likelihood that the one of the activity signals corresponds to a valid system event.

18. The method of claim 14, further including, via the event manager circuit,
providing the control signal for a predetermined amount of time in response to the activity signal being detected by one of the system-event circuits,
continue providing the control signal in response to receiving the validation signal prior to expiration of the predetermined amount of time, and
discontinue providing the control signal in response to not receiving the validation signal prior to expiration of the predetermined amount of time.

19. The method of claim 14, further including
operating a plurality of analog and digital circuits in a non-sleep power-operation mode by providing the control signal in response to the validation signal, and
operating the plurality of analog and digital circuits in a sleep power-operation mode in which less power is consumed from the internal power supply than in the non-sleep power-operation mode, by ceasing to provide the control signal in response to the absence of the validation signal and therein controlling the internal power supply to disconnect the power signal from all of the analog and digital circuits.

20. An apparatus, comprising:
an internal power supply configured and arranged to use battery power to operate a plurality of analog and digital circuits in a non-sleep power mode, and to disconnect power to the plurality of analog and digital circuits in a sleep power mode;
an event manager circuit configured and arranged to detect activity signals corresponding to a respective one of a plurality of system events presented via one of a plurality of inputs; and
an event validation circuit connected to and powered by the internal power supply in the non-sleep power mode, and configured and arranged to evaluate activity signals detected by the event manager circuit and to provide a validation signal in response to the evaluation indicating that an activity signal is valid,
the event manager circuit being further configured and arranged to control operation of the internal power supply by
operating the internal power supply in the non-sleep power mode for a predetermined amount of time in response to detecting an activity signal,
continue to operate the internal power supply in the non-sleep mode in response to receiving the validation signal prior to expiration of the predetermined amount of time, and
discontinue operating the internal power supply in the non-sleep mode in response to not receiving the validation signal.

* * * * *